(12) United States Patent
Ang et al.

(10) Patent No.: US 6,519,753 B1
(45) Date of Patent: Feb. 11, 2003

(54) PROGRAMMABLE DEVICE WITH AN EMBEDDED PORTION FOR RECEIVING A STANDARD CIRCUIT DESIGN

(75) Inventors: Roger Ang, Fremont, CA (US); Atul Ahuja, Mountain View, CA (US); Mukesh T. Lulla, Fremont, CA (US); Drazen Borkovic, Mountain View, CA (US); Brian D. Small, Portland, OR (US); Charles C. Tralka, San Jose, CA (US); Andrew K. Chan, Palo Alto, CA (US); Kevin K. Yee, San Jose, CA (US)

(73) Assignee: QuickLogic Corporation, Sunnyvale, CA (US)

(*) Notice: Subject to any disclaimer, the term of this patent is extended or adjusted under 35 U.S.C. 154(b) by 0 days.

(21) Appl. No.: 09/451,681

(22) Filed: Nov. 30, 1999

(51) Int. Cl.[7] ............................................... G06F 17/50
(52) U.S. Cl. ....................................................... 716/16
(58) Field of Search ............................ 716/7, 17, 16, 716/14, 18; 326/40; 710/117; 712/201

(56) References Cited

U.S. PATENT DOCUMENTS

| | | | |
|---|---|---|---|
| 5,237,218 A | 8/1993 | Josephson et al. | 307/465 |
| 5,424,655 A | 6/1995 | Chua | 326/40 |
| 5,526,276 A | 6/1996 | Cox et al. | 364/489 |
| 5,544,070 A | 8/1996 | Cox et al. | 364/489 |
| 5,552,720 A | 9/1996 | Lulla et al. | 326/38 |
| 5,661,412 A | 8/1997 | Chawla et al. | 326/38 |
| 5,687,325 A | 11/1997 | Chang | 395/284 |
| 5,729,468 A | 3/1998 | Cox | 364/489 |
| 6,044,453 A * | 3/2000 | Paver | 712/201 |
| 6,211,695 B1 * | 4/2001 | Agrawal | 326/40 |
| 6,311,263 B1 * | 10/2001 | Barlow et al. | 710/117 |

FOREIGN PATENT DOCUMENTS

WO   WO 98/38741   9/1998   ......... H03K/19/177

OTHER PUBLICATIONS

"Field Programmable Gate Array Technology" pp. 1–14 and 98–170 edited by Stephen Trimberger, 1994.
Field–Programmable Gate Arrays by Stephen Brown et al., 1992, pp. 1–43 and 88–202.
Practical Design Using Programmable Logic by David Pellerin and Michael Holley, 1991, pp. 84–98.
1995 QuickLogicData Book, 1995, pp. 1–5 through 2–11 and 6–3 through 6–18.
1998 QuickLogic Data Book, 1998, pp. 1–5 through 2–16.
1995 Actel FPGA Data Book and Design Guide pp. ix–xv, 1–5 through 1–34, 1–51 through 1–101, 1–153 through 1–22, 3–1 through 4–56.

* cited by examiner

Primary Examiner—Matthew Smith
Assistant Examiner—Thuan Do
(74) Attorney, Agent, or Firm—Skjerven Morrill LLP; Norman R. Klivans

(57) ABSTRACT

A programmable device, such as a field programmable gate array, includes a main field that is programmable by the user and at least one embedded portion that is reserved to be programmed with a standard circuit design that is configured, for example, by the manufacturer. The embedded portion is similar to the main field, i.e., it has the same programmable structure, however, the embedded portion is not accessible to the user. In some embodiments, the embedded portion may be pre-programmed with the standard circuit design and in other embodiments the embedded portion is programmed while the user programs the main field. The programmable device may also include signature bits that are used by the programming unit to identify the programmable device as having the embedded portion and which standard circuit design to program into the embedded portion. The signature bit may be programmed after the manufacture of the programmable device or may be hard wired during the manufacture of the device. The programming unit recognizes the configuration of the signature bits and restricts access to embedded portion based on the configuration.

18 Claims, 5 Drawing Sheets

PROGRAMMABLE DEVICE WITH AN EMBEDDED PORTION FOR RECEIVING A STANDARD CIRCUIT DESIGN

FIELD OF THE INVENTION

The present invention relates to a programmable device, such as a field programmable gate array, and in particular to a programmable device with a portion that is programmed with a standard circuit design configured by the manufacturer.

BACKGROUND

Programmable devices, such as programmable logic arrays or field programmable gate arrays, are well known in the art. These devices offer high performance and flexibility of design for the user. Programmable devices typically consist of many repeated portions or "macrocells," which include modules of logic elements and programmable interconnect structures. The logic elements and programmable interconnect structures may be programmed to be interconnected in various configurations as desired by the user. Thus, the user can program the device with a desired circuit design.

FIG. 1 shows a simplified view of a conventional programmable device 10.

Programmable device 10 is shown with five rows and five columns of logic elements, referred to herein as logic cells 12, and a plurality of interconnecting routing resources 14, shown schematically as lines. Of course, conventional programmable devices typically have many more logic cells than shown in FIG. 1. A plurality of input/output ("I/O") pins 16 are also shown in FIG. 1. Routing resources 14 are connected with programmable antifuses (not shown) that may be programmed to interconnect particular logic cells 12 and I/O pins 16 in various configurations as desired by the user.

To configure a programmable device, the user configures the interconnect structures, i.e., routing resources 14 and antifuses (not shown) so that selected input terminals and selected output terminals of selected on-chip circuit components, i.e., logic cells 12, are electrically connected together in such a way that the resulting circuit is the specific circuit desired by the user. In a programmable device employing, for example, amorphous silicon antifuses, selected amorphous silicon antifuses disposed between selected wire segments are "programmed" to connect the selected wire segments together electrically. Which antifuses are programmed and which antifuses are left unprogrammed determines how the circuit components are interconnected and therefore determines the resulting circuit.

A field programmable gate array (an "FPGA") is one type of programmable device. For background information on field programmable gate arrays that employ antifuses, see: "Field Programmable Gate Array Technology" edited by Stephen Trimberger, 1994, pages 1–14 and 98–170; "Field-Programmable Gate Arrays" by Stephen Brown et al., 1992, pages 1–43 and 88–202; "Practical Design Using Programmable Logic" by David Pellerin and Michael Holley, 1991, pages 84–98; the 1995 QuickLogic Data Book, 1995, pages 1–5 through 2–11 and 6–3 through 6–18; the 1998 QuickLogic Data Book, 1998, pages 1–5 through 2–16; the 1995 Actel FPGA Data Book and Design Guide, 1995, pages ix–xv, 1–5 through 1–34, 1–51 through 1–101, 1–153 through 1–22, 3–1 through 4–56; U.S. Pat. No. 5,424,655 entitled "Programmable Application Specific Integrated Circuit Employing Antifuses and Methods Therefor". The contents of these documents are incorporated herein by reference.

Conventionally, when a user desires a specific device, the user must design the entire desired circuit. Once the desired circuit is designed, the programmable device is programmed accordingly.

Often there are certain elements within a user's design that are functionally similar to elements in other user's designs. This is true even if the different user's circuits function differently. Thus, in a conventional programmable device users are required to design and program standard aspects of their desired circuits.

Unfortunately, these standard elements may have complex timing and routing criteria making the design of these standard elements very difficult. Consequently, the user may spend an inordinate amount of time attempting to design a standard element in the user's circuit design. Further, because a programmable device cannot be unprogrammed, if the user makes a mistake in configuring a standard element, the programmable device may be programmed with a bad design and wasted.

Thus, what is needed is a programmable device that is embedded with a standard circuit design so the user does not need to design and program that element of the design.

SUMMARY

A programmable device, in accordance with an embodiment of the present invention, includes a main field that is programmable by the user and at least one embedded portion that is reserved to be programmed with a standard circuit design, which is configured, e.g., by the manufacturer. The embedded portion of the programmable device is structurally similar to the main field, i.e., it has the same or similar programmable structure. However, the embedded portion is not accessible to be programmed by the user. In some embodiments, the embedded portion may be pre-programmed with the standard circuit design and in other embodiments the embedded portion is automatically programmed when the user programs the main field.

The programmable device may also include signature bits that are used by the programming unit to identify the programmable device as having the embedded portion and the particular standard circuit design that is or will be programmed into the embedded portion. The signature bits may be programmed after the manufacture of the programmable device or may be hard wired during the manufacture of the device. When the user programs the programmable device, the programming unit recognizes the configuration of the signature bits and restricts access to embedded portion based on the configuration.

With an embedded portion programmed with a standard circuit design, there is no need for the user to design that element. Thus, the user's design is simplified and the risk of waste is reduced.

DETAILED DESCRIPTION

Figure 1:
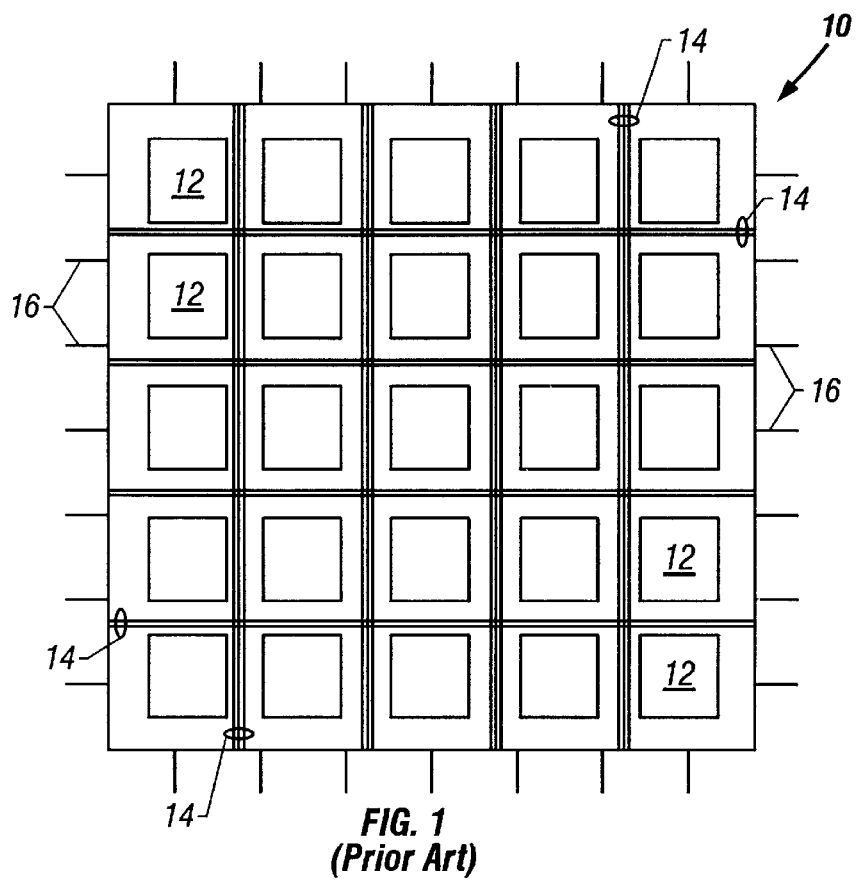
FIG. 1 shows a schematic view of a conventional programmable device with a main field having a plurality of logic cells and interconnecting routing resources.
Figure 2:
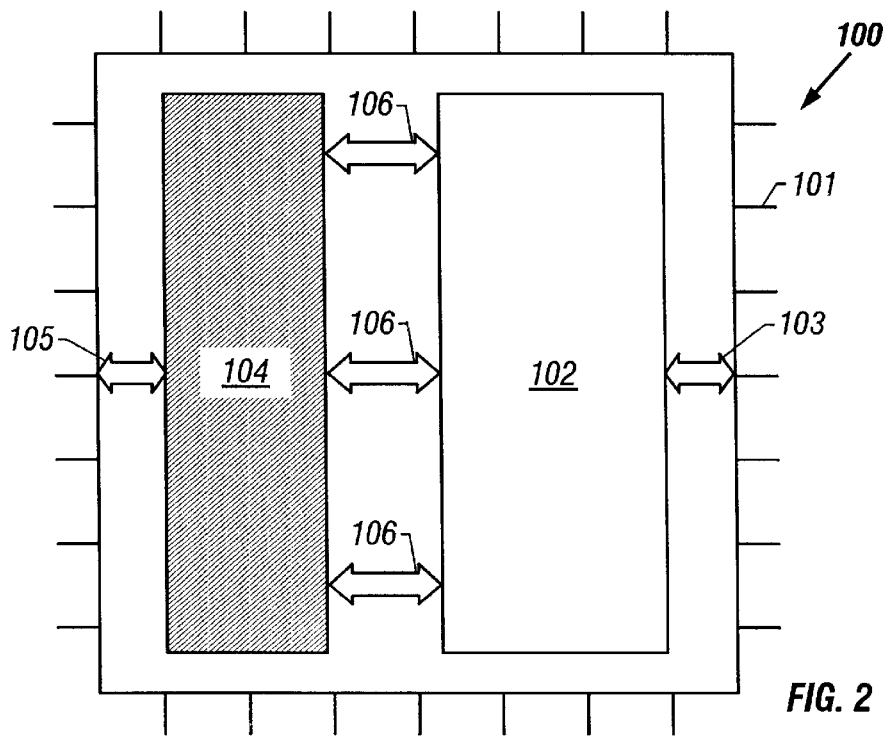
FIG. 2 shows a simplified diagram of a programmable device with a main field that is programmable by the user and an embedded portion that is reserved to be programmed with a standard circuit design.

FIG. 2 shows a simplified diagram of a programmable device 100 with I/O leads 101 and that includes a main field 102 and an embedded portion 104. Programmable device 100, is similar to programmable device 10, shown in FIG. 1, with the main field 102 of programmable device 100 being programmable by the user. However, programmable device 100 includes embedded portion 104, which is not programmable by the user.

Embedded portion 104 has a physical structure that is the same or similar to that of the main field 102, i.e., embedded portion 104 is programmable. However, while main field 102 may be programmed by the user, embedded portion 104 is reserved to be programmed, e.g., by the manufacturer, with a desired standard circuit design that will produce a desired function or functions. When the programmable device 100 is programmed, it will have the manufacturer's standard circuit design embedded into the user's circuit design at embedded portion 104.

While FIG. 2 shows embedded portion 104 as separate from main field 102, it should be understood that embedded portion 104 may be within main field 102. Arrows 106 indicate the communication between embedded portion 104 and main field 102. It should be understood, that both embedded portion 104 and main field 102 may both be in communication with I/O leads 101 as indicated by arrows 105 and 103, respectively, or alternatively, only one of the main field 102 or embedded portion 104 may be in communication with I/O leads 101.

Embedded portion 104 may be pre-programmed by the manufacturer. For example, during production of programmable device 100, the manufacturer programs embedded portion 104 such that when the user receives programmable device 100, the embedded portion 104 is already programmed with the desired product. The user may then program the remainder of programmable device 100, i.e., main field 102, with the user's desired circuit design.

In another embodiment, embedded portion 104 remains unprogrammed until the user programs the main field 102 of the programmable device with the user's desired circuit. The user is not able to program the embedded portion 104. During the programming operation, the embedded portion 104 will automatically be programmed with the manufacturer's standard circuit design while the main field 102 is programmed with the user's desired circuit design.

Figure 3:
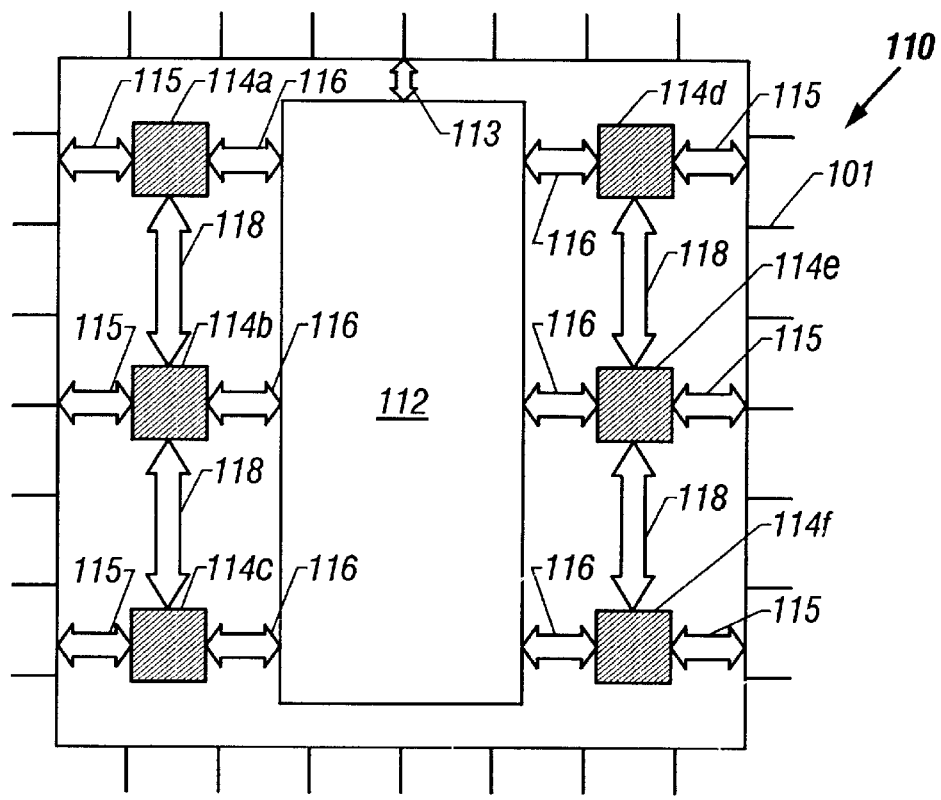
FIG. 3 shows a simplified diagram of a programmable device with a main field and a plurality of embedded portions.

FIG. 3 shows a simplified diagram of a programmable device 110 in accordance with another embodiment of the present invention. Programmable device includes a main field 112 and a plurality of embedded portions 114a–114f.

Embedded portions 114a–114f are similar to embedded portion 104, shown in FIG. 2, however, embedded portions 114a–114f are not reserved in one contiguous location in programmable device 110. Consequently, embedded portions 114a–114f may be dispersed throughout main field 112. It should be understood that one standard circuit design may be programmed into embedded portions 114a–114f or that multiple standard circuit designs may be programmed into a plurality of embedded portions 114a–114f.

As shown in FIG. 3, embedded portions 114a–114f may be in direct communication with main field 112, as indicated by arrows 116, as well as in direct communication with each other, as indicated by arrows 118. Of course, embedded portions 114a–114f and main field 112 may be in direct communication with I/O leads 101, as indicated by arrows 115 and 113, respectively.

The embedded portion is programmed with a standard circuit design that is configured by someone other than the user, such as the manufacturer of the programmable device. The standard circuit design may be for example, a controller for a PCI bus as described in the 1999 QuickLogic Data Book, 1999, pages 2–1 through 2–70, which is incorporated herein by reference. It should be understood that any circuit design may be used as the standard circuit design. Configuring a standard circuit design for a programmable device, such as a field programmable gate array, is well within the abilities of those skilled in the art.

Because the manufacturer configures the standard circuit design that is programmed into the embedded portion, any difficulties that arise in the circuit design, such as timing, routing, or efficient resource utilization, may be resolved by the manufacturer. Consequently, the user is not required to configure what may be a difficult but common element in circuit design.

Figure 4:
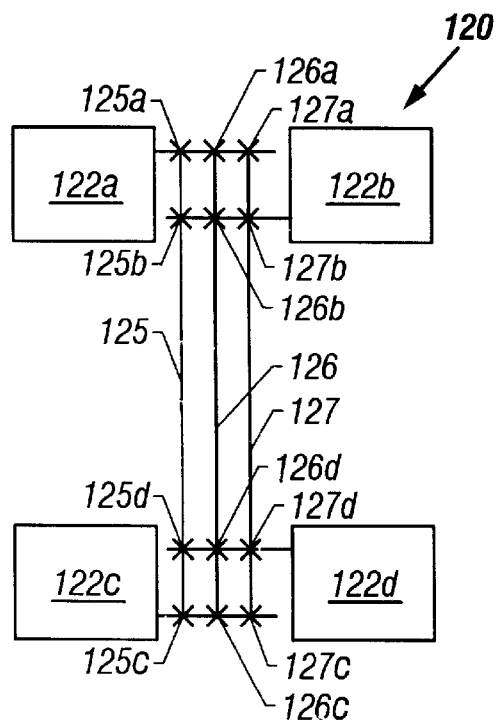
FIG. 4 shows the logic cells and routing resources in a portion of an embedded portion.

If desired, certain elements of the standard circuit design configured by the manufacturer may be left undecided until the user's circuit design is finalized while the functionality of the standard circuit design is fixed. FIG. 4 shows a portion 120 of embedded portion 104 with logic cells 122a, 122b, 122c, and 122d and routing resources 125, 126, 127. Logic cells 122a–122d may be programmed to be coupled to routing resources 125, 126, and 127 through antifuses 125a–125d, 126a–126d, and 127a–127d, respectively. Thus, logic cell 122a may be coupled to logic cell 122d through one of routing resources 125, 126, or 127 using antifuses 125a, 125d; 126a, 126d; or 127a and 127d, respectively. In the configured standard circuit design, the particular routing resource 125–127 to be used may be left undecided until the user's circuit design is finalized. However, the particular logic cells to be assigned to the standard circuit design may be fixed. Once the user's circuit design is finalized, the standard circuit design is optimized for timing and resources. Thus, for example, a decision is made which routing resource 125–127 to use based on the overall configuration, including the user's circuit design to be programmed into the main field 102 and the standard circuit design to be programmed into embedded portion 104. Optimization of a circuit design is well known in the art, and thus, the particular methods to do this need not be discussed herein.

Figure 5:
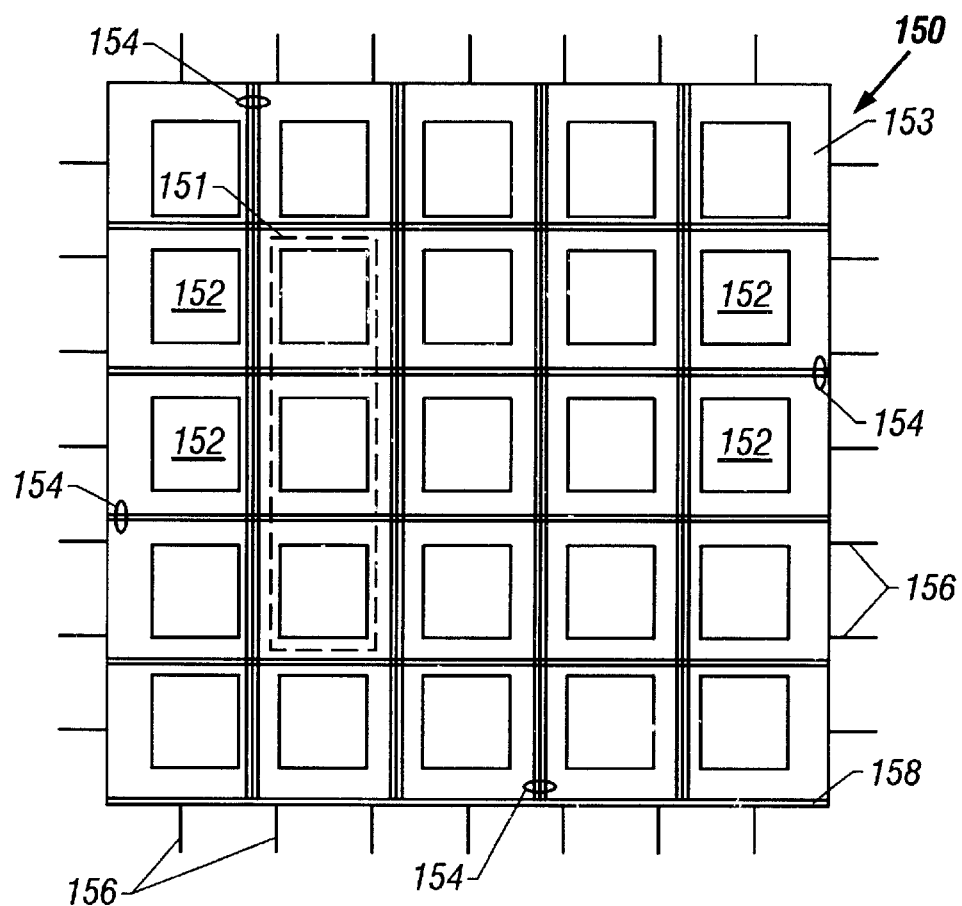
FIG. 5 shows a schematic view of a programmable device with an embedded portion and signature bits in accordance with an embodiment of the present invention.

FIG. 5 shows a schematic view of a programmable device 150 with embedded portion 151 shown as located within main field 153 and having signature bits 158. As shown in FIG. 5, the main field 153 and embedded portion 151 of programmable device 150 includes a plurality of logic cells 152, a plurality of interconnecting conductors, i.e., routing resources 154, and I/O pins 156 with associated I/O cells (not shown). Similar to programmable device 10 shown in FIG. 1, the routing resources 154 of programmable device 150 are connected to programmable antifuses (not shown) that are programmed by the user to interconnect particular logic cells 152 and I/O pins 156 in various configurations.

Programmable device 150 may be, for example, a conventional field programmable gate array, such as the type disclosed in U.S. Pat. No. 5,424,655, which is incorporated herein by reference. However, unlike conventional programmable devices, embedded portion 151 is rendered inaccessible to the user and is programmed with the manufacturer's standard circuit design.

It should be understood that the specific number of logic cells 152 shown in FIG. 5 is for the sake of simplicity and that programmable device 150 may have many more logic cells 152 and the embedded portion 151 may also include many more logic cells 152. In addition, programmable device 150 may have many more I/O pins than shown in FIG. 5.

Signature bits 158 in programmable device 150 are used to indicate whether the device has an embedded portion 151 as well as what type of standard circuit design is to be programmed into the embedded portion 151. Thus, for example, signature bits 158 may identify a desired part number, which represents a programmable device having a particular standard circuit design embedded on it. During programming by the user, the part number is used by the mapping software to indicate if the device has an embedded portion 151 and if so to identify the location of the embedded portion 151 that is reserved for the manufacturer's design as well as to identify the particular standard circuit design that is to be programmed into the embedded portion 151.

Signature bits 158 are programmable so that their configuration is used to identify whether the programmable device 150 is to have an embedded portion 151, the location of the embedded portion 151, and the particular design to be programmed into the embedded portion 151, may be determined after the programmable device 150 is manufactured. Thus, advantageously, the manufacturer does not have to commit to the particular type of design to be programmed into the embedded portion 151 or even if the programmable device 150 will have an embedded portion 151 until after the manufacture. In the alternative, signature bits 158 can be hardwired into the programmable device 150 during manufacture, and thus the determination of whether an embedded portion 151 is present and the type of design to be programmed into the embedded portion 151 is made during manufacture.

Thus, signature bits 158 will have one configuration for a programmable device 150 that does not have an embedded portion 151, a different configuration for a programmable device 150 that has an embedded portion 151 that is to be programmed with one type of design, and yet another configuration for a programmable device 150 that has an embedded portion 151 that is to be programmed with a different design.

Figure 6:
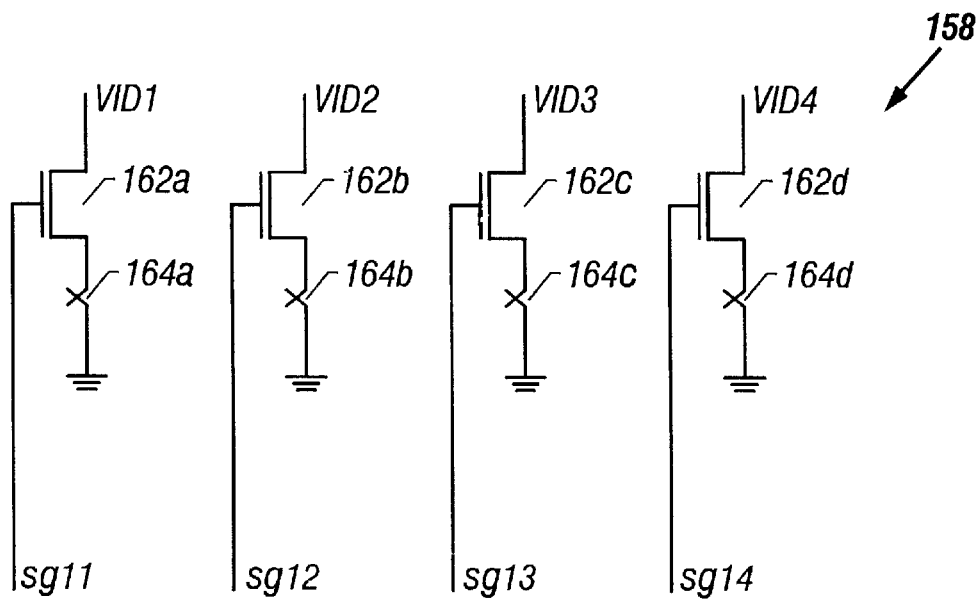
FIG. 6 shows a schematic view of programmable signature bits.

FIG. 6 shows a schematic view of programmable signature bits 158, in accordance with an embodiment with the present invention. As shown in FIG. 6, signature bits 158 include four transistors 162a, 162b, 162c, and 162d, each coupled to a valid line, i.e., vld1, vld2, vld3, and vld4, respectively, and coupled to a ground reference voltage through programmable antifuses 164a, 164b, 164c, 164d, respectively. The gate of each transistor is coupled to a signature line, sgl1, sgl2, sgl3, and sgl4, respectively. As is well understood in the art, antifuses 164a–164d act as insulators until programmed and then will act as conductors. Thus, signature bits 158 may be programmed with different configurations by programming any number of antifuses 164a–164d. An individual signature bit is programmed by applying a high voltage on the appropriate valid line, e.g., vld1, and turning on the appropriate signature line, e.g., sgl1, to program the antifuse, e.g., 164a. The conductance at the valid line, e.g., vld1, is measured to determine if that signature bit is programmed, i.e., a "1", or not, i.e., a "0". Antifuses 164a–164d may be programmed by the manufacturer in a conventional fashion.

It should be understood that while FIG. 6 shows signature bits 158 as including four bits, i.e., four antifuses 164a–164d, signature bits 158 may have any number of bits, for example, between one and thirty-two bits. Further, it should be understood that alternative devices may be used as individual signature bits, including fuses, and appropriate memory devices, such as EPROMS.

Moreover, while signature bits 158 are shown as programmable in FIG. 6, as discussed above, signature bits 158 may be hardwired by placing the desired valid lines in electrical contact with a ground reference voltage in the desired configuration during the manufacture of programmable device 150. This may be done, for example, using a different mask for each desired configuration of signature bits 158.

By way of an example, a specific four bit configuration ("0000") of signature bits 158 may be used to identify a programmable device 150 that does not have an embedded portion 151 reserved for the manufacturer's design. Thus, a configuration of "0000" identifies a conventional programmable device. However, the signature bits 158 may be altered to a different configuration ("1000") to identify a programmable device 150 that has an embedded portion 151 to be programmed with a desired standard circuit design. Different configurations of signature bits 158 may be used to identify a number of different programmable devices having embedded portions to be programmed with different designs.

Because signature bits 158 use antifuses, once a bit is programmed it may not be unprogrammed. However, in accordance with the present invention, a single product line may be identified with multiple configurations of the signature bits 158. For example, the signature bits 158 may have a configuration of "0000" as well as "1111" to identify a programmable device 150 that does not have an embedded portion. Thus, if signature bits 158 have been programmed to have a "1000" configuration identifying the device as having an embedded portion 151, the signature bits 158 maybe altered by subsequent programming so that the configuration is "1111" identifying the device a programmable device 150 without the embedded portion. Likewise, a configuration of "1000" or "1110" may indicate that the embedded portion 151 is to be programmed with a first desired standard circuit design. Thus, if signature bits 158 are programmed with a configuration of "1100" to identify that the embedded portion 151 is to be programmed with a second desired standard circuit design, the first desired standard circuit design may be re-designated by programming the signature bits 158 into the configuration "1110".

It should be understood that programming the signature bits 158 is done by the manufacturer and is separate from the actual programming of the main field 153 or embedded portion 151 of the programmable device 150. Thus, even if signature bits 158 are programmed to identify the device as having an embedded portion 151, the device itself is still unprogrammed. As discussed above, the embedded portion 151 may be pre-programmed by the manufacturer or may be programmed at the same time the user programs the main field 153. Consequently, the main field 153 is unprogrammed, and in some embodiments the embedded portion 151 is unprogrammed until the user programs the device. Thus, until the user programs the device or the manufacturer pre-programs the embedded portion 151, a programmable device 150 that uses an embedded portion 151 and a programmable device 150 that does not use an embedded portion 151 are physically the same except for the configuration of the signature bits 158.

Figure 7:
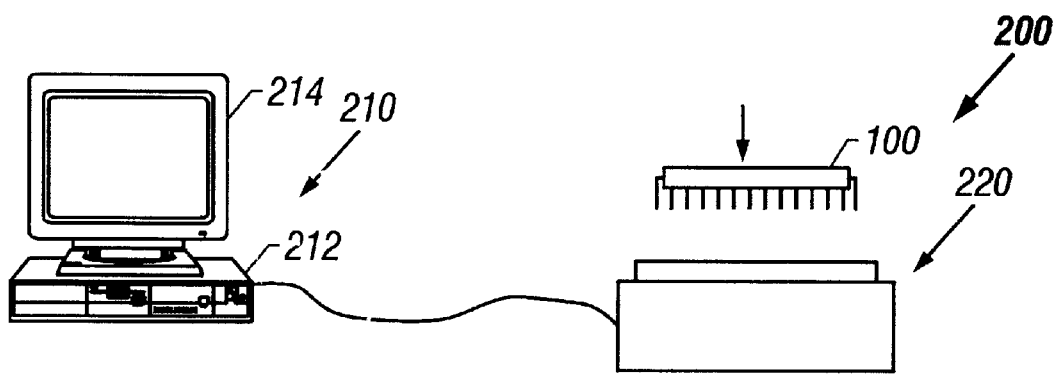
FIG. 7 is a programming device including a computer for mapping the user's desired design onto the main field of the programmable device and a programming unit for programming the programmable device.

FIG. 7 shows a simplified view of a programming apparatus 200 that is used to program programmable device 150. As shown in FIG. 7, programming apparatus 200 includes a computer 210 and a programming unit 220. Computer 210 includes a microprocessor 212 and a monitor 214 and is used by the user to map a desired circuit design onto the programmable device 150. Computer 210 may be a conventional personal computer, while programming unit 220 is, for example, a DeskFab TM unit sold by QuickLogic, Inc., located in Sunnyvale, Calif. Computer 210 is shown physically connected to programming unit 220, however, it should be understood that in one embodiment computer 210 and programming unit 220 may be stand alone units and communicate via appropriate memory media, such as floppy disk or CD ROM. A programmable device 150 is shown in FIG. 7, in a side view, being inserted into programming unit 220.

It should be understood that while programmable device 150 is shown being inserted into programming unit 220, programmable device 100 or 110 are programmed in a similar way.

The particular methods used to program a programmable device 150 depends on the type and manufacture of programming device 150. However, the general operation and processes used by programming apparatus 200 to program a programmable device 150 with a user's desired circuit design is well known to those of ordinary skill in the art. For more information related to programming programmable devices see: U.S. Pat. No. 5,552,720, entitled "Method for Simultaneous Programming of Multiple Antifuses," issued Sep. 3, 1996; U.S. Pat. No. 5,544,070, entitled "Programmed Programmable Device and Method for Programming Antifuses of a Programmable Device," issued Aug. 6, 1996; U.S. Pat. No. 5,661,412, entitled "Reducing Programming Time of a Field Programmable Gate Array Employing Antifuses," issued Aug. 26, 1997; U.S. Pat. No. 5,526,276, entitled "Select Set-Based Technology Mapping Method and Apparatus," issued Jun. 11, 1996, and U.S. Pat. No. 5,729,468, entitled "Reducing Propagation Delays in a Programmable Device," issued Mar. 17, 1998, all of which are incorporated herein by reference.

In general, when a user desires to program a programmable device 150 with a desired circuit design, the user maps the desired design onto a software model of the programmable device 150 with computer 210 using appropriate software, as is well known to those of ordinary skill in the art. For example, computer 210 may use software such as QuickWorks TM, produced by QuickLogic, so that the user may map a desired design onto a model of the programmable device 150. During this process, the user is typically presented with a view of the model of the programmable device via monitor 214.

In accordance with the present invention, the embedded portion 151 is inaccessible to the user. Thus, the model of the programmable device will have the embedded portion 151 grayed out. While the user needs to know the functionality of the embedded portion 151 along with the interface ports of the embedded portion 151, the user does not need to see the precise circuit design to be programmed in the embedded portion 151.

Figure 8:
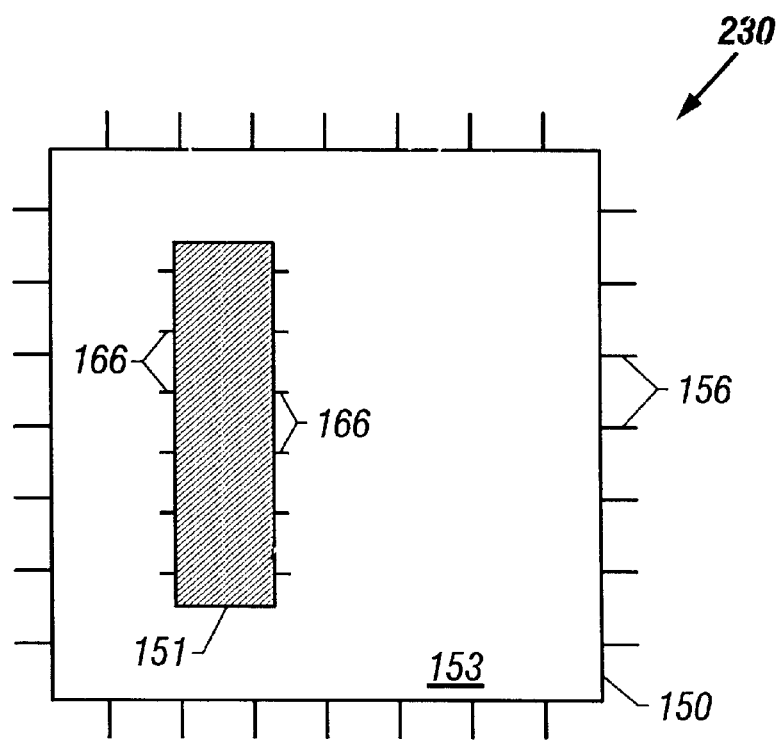
FIG. 8 shows the user's view of a programmable device the virtual programmable device as the user maps the desired design onto the programmable device.

FIG. 8 shows a simplified user's view 230 of a model of a programmable device 150 having an embedded portion as shown on monitor 214 in accordance with an embodiment of the present invention. As can be seen in FIG. 8, the user is presented with a view of the entire programmable device 150, including all the I/O pins and the entire programmable main field 153. It should be understood that the user is presented with details within the main field 153. The embedded portion 151 is grayed out, indicating to the user that this portion of the programmable device 150 is reserved for the standard circuit design. However, if desired, the user's view 230 may show details of the circuit design to be programmed into embedded portion 151. The user is also presented with a view of the input/output terminals 166 of the embedded portion 151. The user is also presented with the functionality of embedded portion 151 in the form of simulation data. Thus, the user is presented with design data in a design file and a simulation data in a separate file, where the simulation data describes the functionality of the embedded portion 151. As can be seen in FIG. 8, signature bits 158 need not be shown in the user's view 230 because signature bits 158 are not programmed by the user.

Because the process of mapping a desired design onto a model of virtual programmable device 150 on computer 210 is done in software and does not require the actual presence of the programmable device 150, the computer 210 will not have access to signature bits 158. Consequently, it is necessary for computer 210 to recognize the particular product line to be programmed, i.e., whether there is an embedded portion 151 and if so what circuit design is to be programmed into embedded portion 151. Thus, an identifier, such as the part number, is used to identify the product line for computer 210.

Figure 9:
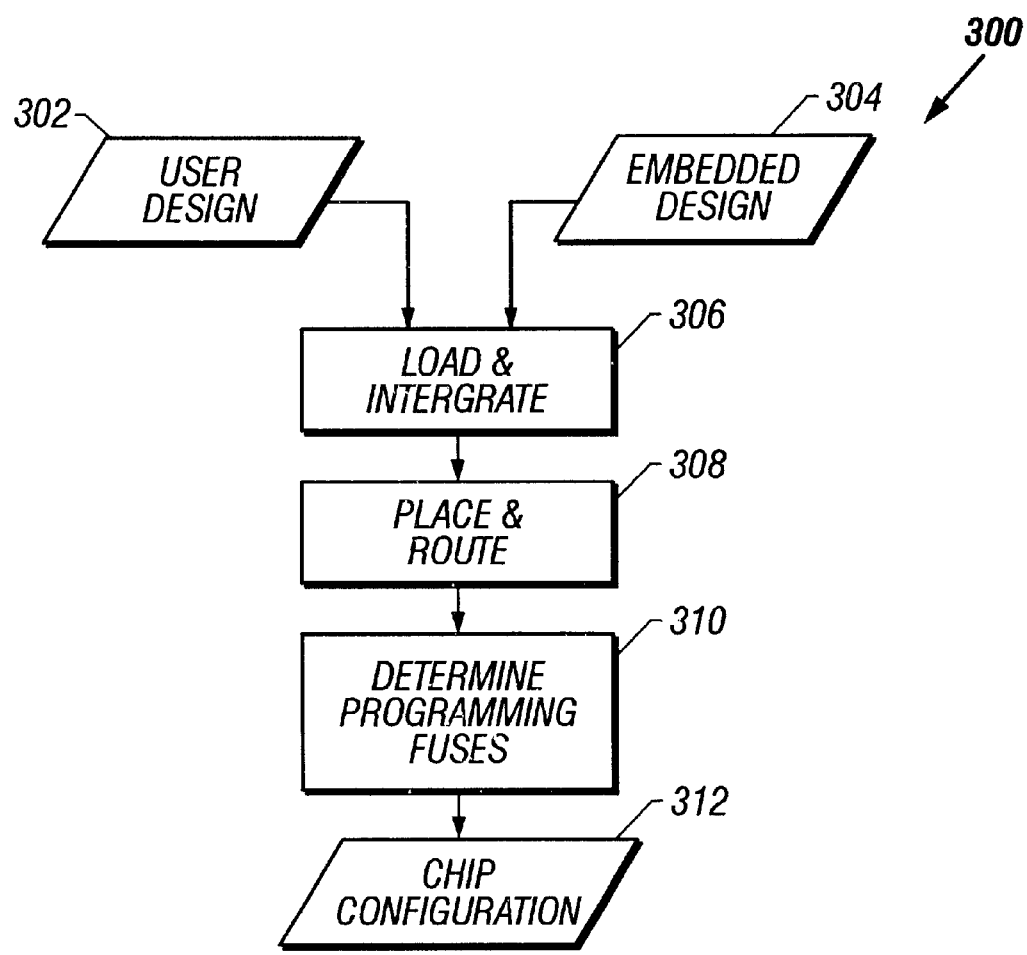
FIG. 9 is a flow chart showing the mapping process.

FIG. 9 is a flow chart showing the process 300 of mapping the user's design and the embedded design onto a programmable device in accordance with an embodiment of the present invention. As shown in FIG. 9, the user design (block 302) and the embedded design (block 304) are loaded and integrated at step 306. The user design 302 includes the target part selected, i.e., the part number of the desired device. The part number determines the embedded design 304 that will be integrated into the design. Initially, the user design 302 will be a circuit described as a collection of connected logic gates, known as a logic netlist, which is created by the user. Subsequent steps, described below, will add information for the mapping of these gates to cells in the device and the interconnection of these cells. The embedded design 304 is described as a mapped, placed and routed logic netlist. That is, the placement of the embedded design 304 as well as the mapping to cells and routing of the embedded design 304 is predetermined by the manufacturer as opposed to the user.

It should be understood that the user design 302 and the embedded design 304 are software descriptions of the designs. In one embodiment, the programmable device is not yet programmed with the user design but is already programmed with the embedded design. In other words, the embedded design's 304 functionality, including its position and routing, is fixed in the programmable device prior to programming (or mapping) by the user. Nevertheless, the embedded design 304 is loaded and integrated in step 306 so that the user design 302 may be properly mapped onto the programmable device.

In another embodiment, the programmable device is not yet programmed with either the user design 302 or the embedded design 304. Thus, the embedded design 304 and user design 302 are mapped together in process 300 and then are programmed into the programmable device at approximately the same time. Because the embedded design 304 is not fixed in the programmable device, the description of the embedded design 304, including its placement and routing logic netlist may be completely fixed or, alternatively, may be adjusted in response to the users design. Thus, for example as described in reference to FIG. 4, the functionality of the embedded design 304 may be fixed but the particular routing resources used between cells in embedded design 304 may be altered between equivalent routing resources.

Integrating the user design 302 with the embedded design 304 requires matching the interconnects between the user design 302 and the embedded design 304. When creating the user design 302, the user is provided with a description of the interface with the embedded design 304 (in/out ports of cells in the embedded design 304). Thus, the user creates the user design 302 using the description of the interface to the embedded design 304 as points of connection. The points of connection to the embedded design 304 are saved into the user design 302 using the interface description. The interface description is also saved in the embedded design 304, and during loading is used to correlate the user design 302 connections and the embedded design 304 connections. Each embedded design 304 interface port may potentially be connected to a logic signal in the user design 302 and the embedded design 304. Thus, internally these signals will be merged together since they are logically the same signal.

With the user design 302 and embedded design 304 loaded and integrated, the next step 308 is to place and route the designs. As discussed above, the embedded design 304 may be already placed and routed and thus, the cell and routing resources have been assigned and reserved for the embedded design 304 (and in one embodiment, already programmed into the programmable device). Placement of the user design 302 is a straightforward assignment of the logic to cells in the chip that have not been reserved for the embedded design 304. Routing of the user design 302 is accomplished by assigning routing resources to the user design 302 that are not already used by the embedded design 304.

The interface interconnections between user design 302 and the embedded design 304 are also routed. As described above, in one embodiment the internal routing of the embedded design 304 to the interface connections is fixed, and thus no routing internal to the embedded design 304 is necessary. Thus, only the connection of the user design 302 to the interface interconnection requires routing.

In the embodiment where the functionality of the embedded design 304 is fixed, but the interconnecting structure of the embedded design 304 may be altered, the interconnect structure reserved for embedded design 304 may be changed. For the embedded design 304, altering the interconnect structure moves a signal from one set of conductors and antifuses to a functionally equivalent set of conductors and antifuses. In this embodiment, the complete routing of the chip, including the user design 302 and the embedded design 304 and their interface interconnections, is saved to the file.

In step 310, the programming fuses are determined. Thus, in one embodiment the links to program the user design 302 and the embedded design 304 are conventionally determined. In another embodiment as described above, the embedded design 304 is already programmed on the programmable device, and thus, only the links used to program the user design 302 is determined. The links are ordered to reduce programming time by utilizing the multi-bit capability of the programming unit.

In step 312, the chip configuration is saved to a file. If the embedded design 304 is already programmed on the programmable device, the chip configuration includes the part number and the user design's 302 logic netlist, placement, routing, and links. If the embedded design 304 is to be programmed onto the programmable at the same time as the user design 302, the chip configuration includes the part number, the logic netlist of the user design 302, placement of user design 302, routing of user design 302 and the embedded design 304, and links for the user design 302 and the embedded design 304.

Process 300 is similar to conventional mapping processes, for example found in QuickWorks TM, sold by QuickLogic, except for the addition of embedded design 304. Thus, process 300 incorporates the user configured design with the manufacturer configured design. A software engineer of ordinary skill in the art is capable of writing the necessary code to incorporate the user design and the embedded design as described in process 300.

Once the user maps the user design 302 and the embedded design 304 onto the programmable device as described in process 300, the file with the chip configuration is transferred to the programming unit 220 to actually program the programmable device as described in reference to FIG. 7. The programming unit 220, for example may use QuickPro TM to program the programmable device. The programming of the programmable device may include a check of the signature bits 158 on the programmable device with the part number saved in the chip configuration file. If the signature bits 158 and the part number do not match, an error message is produced and the device is not programmed.

It should be understood that the present invention may be implemented without signature bits 158. Thus, when the user maps the design onto the programmable device, the part number or another identifier is used to determine whether an embedded portion is included on the programmable device. The programming unit 220 then programs the programmable device in accordance with the map, and thus does not need signature bits 158. However, if an incorrect identifier is used during the mapping process, an incorrect or no standard circuit design may be programmed into the embedded portion or the users design will not interface correctly with the embedded portion.

Use of a programmable device with an embedded portion permits several product lines to be generated from a single programmable device. By adjusting signature bits 158, either by programming or by hardwiring the signature bits 158 during manufacture, different product lines using different circuit designs in the embedded portion 151 may be quickly and easily produced. Of course, the manufacturer's desired standard circuit design for the embedded portion 151 must be generated. Because the desired circuit design is programmed into the embedded portion 151 as opposed to physically hardwiring an ASIC type circuit onto the chip during manufacture, the manufacturer may quickly, easily, and inexpensively produce many different designs for the embedded portion.

While the present invention has been described in connection with specific embodiments, one of ordinary skill in the art will recognize that various substitutions, modifications and combinations of the embodiments may be made after having reviewed the present disclosure. The specific embodiments described above are illustrative only. Various adaptations and modifications may be made without departing from the scope of the invention. For example, alternative types of signature bits may be used, including the use of fuses. Further, embedded design may be programmed into the programmable device prior to or simultaneously with the users design. Moreover, the embedded design may be a completely fixed design or the embedded design may be alterable in functionally equivalent ways, e.g., altering the routing resources within the embedded design to optimize timing and resources. The spirit and scope of the appended claims should not be limited to the foregoing description.

What is claimed is:

1. A field programmable gate array device comprising:
   a plurality of identical logic cells arranged in an array;
   a plurality of conductive lines for programmably interconnecting said logic cells, the plurality of logic cells being partitioned into:
      a main field that is programmable by a user with the user's desired circuit design; and
      at least one programmable embedded portion within said main field that is not programmable with the user's desired circuit design, said embedded portion is reserved to be programmed with a standard circuit design.

2. The device of claim 1, further comprising at least one signature bit indicating that said programmable device includes said at least one embedded portion.

3. The device of claim 2, comprising a plurality of signature bits.

4. The device of claim 1, wherein said signature bit is programmable.

5. The device of claim 1, wherein said programmable device is a field programmable gate array.

6. The device of claim 1, wherein said embedded portion is programmed with said standard circuit design when said main field is programmed with the user's desired circuit design.

7. The device of claim 1, wherein said standard circuit design is configured by someone other than said user.

8. The device of claim 1, wherein said embedded portion is programmed with said standard circuit design prior to said main field being programmed with the user's desired circuit design.

9. The device of claim 1, further comprising a plurality of embedded portions, wherein each embedded portion is reserved to be programmed with a different standard circuit design.

10. A method of programming a field programmable gate array device, comprising a plurality of identical logic cells arranged in an array and a plurality of conductive lines for interconnecting said logic cells, is said method comprising:
    partitioning the plurality of logic cells into a main field that is programmable by a user and an embedded portion that is reserved to be programmed with a standard circuit design;
    providing a user design;
    providing an embedded standard circuit design;
    mapping said user design into the main field and said embedded design into said embedded portion of said device; and
    programming at least said user design onto said device.

11. The method of claim 10, further comprising:
    programming said embedded design onto said device at approximately the same time as said programming at least said user design onto said device.

12. The method of claim 10, further comprising:
    programming said embedded design onto said device prior to said programming at least said user design onto said device.

13. The method of claim 10, wherein said mapping said user design and said embedded design onto said device comprises:
    loading said user design;
    loading said embedded design;
    integrating said user design and said embedded design;
    placing said user design; and
    routing said user design.

14. The method of claim 13, wherein placing said user design comprises assigning logic within said user design to cells in said device that are not used by said embedded design.

15. The method of claim 13, wherein routing said user design comprises assigning routing resources in said device that are not already used by said embedded design.

16. The method of claim 13, further comprising assigning routing resources to said user design for an interface interconnection between said user design and said embedded design.

17. The method of claim 16, further comprising assigning routing resources to said embedded design for said interface interconnection between said user design and said embedded design.

18. The method of claim 10, wherein said embedded design is provided by the manufacturer of said device.

* * * * *